United States Patent
Ogura

[11] Patent Number: 5,888,297
[45] Date of Patent: Mar. 30, 1999

[54] METHOD OF FABRICATING SOI SUBSTRATE

[75] Inventor: Atsushi Ogura, Tokyo, Japan

[73] Assignee: NEC Corporation, Japan

[21] Appl. No.: 570,232

[22] Filed: Dec. 11, 1995

[30] Foreign Application Priority Data

Jan. 9, 1995 [JP] Japan .................................. 7-017480

[51] Int. Cl.[6] .............................................. C30B 25/02
[52] U.S. Cl. ............................... 117/94; 117/84; 117/106
[58] Field of Search .................................. 117/1, 2, 3, 45, 117/902, 928, 84, 108, 94, 106; 437/11, 20; 438/479, 967

[56] References Cited

U.S. PATENT DOCUMENTS

| | | | |
|---|---|---|---|
| 5,061,642 | 10/1991 | Fujioka ..................................... | 437/11 |
| 5,183,767 | 2/1993 | Baratte et al. ............................. | 437/11 |
| 5,244,819 | 9/1993 | Yue ........................................... | 437/11 |

FOREIGN PATENT DOCUMENTS

| | | |
|---|---|---|
| 362143471A | 6/1987 | Japan . |
| 401094642A | 4/1989 | Japan . |
| 2253622 | 10/1990 | Japan . |
| 4212738 | 8/1992 | Japan . |
| 405286799A | 11/1993 | Japan . |
| 065826 | 1/1994 | Japan . |

OTHER PUBLICATIONS

"The Anomalous Depth Distribution of Low Dose Oxygen and Nitrogen Ions Implanted into Silicon."; Wong, J.K.Y., et al; Vacuum (1993), 44(3–4), pp. 219–222. (Abstract Only!).

Nakashima et al, "Analysis of Buried Oxide Layer Formation and Mechanism of Threading Dislocation Generation in the Substoichiometric Oxygen Dose Region"; Mar. 1993; pp. 523–534; Journal of Material Research, vol. 8 No. 3.

Primary Examiner—Felisa Hiteshew
Attorney, Agent, or Firm—Hayes, Soloway, Hennessey, Grossman & Hage, P.C.

[57] ABSTRACT

The invention provides a method of fabricating an SOI substrate including the steps of introducing crystal defects at a desired depth in a silicon substrate, and thereafter, implanting oxygen or nitrogen ions into the silicon substrate, and thermally annealing the silicon substrate. The method of the present invention makes it possible to fabricate an SOI substrate with fewer crystal defects and lower fabrication cost than is possible according to the prior art.

10 Claims, 3 Drawing Sheets

A

O⁺ IMPLANTATION
+
THERMAL ANNEALING
(HIGH TEMP.)

B

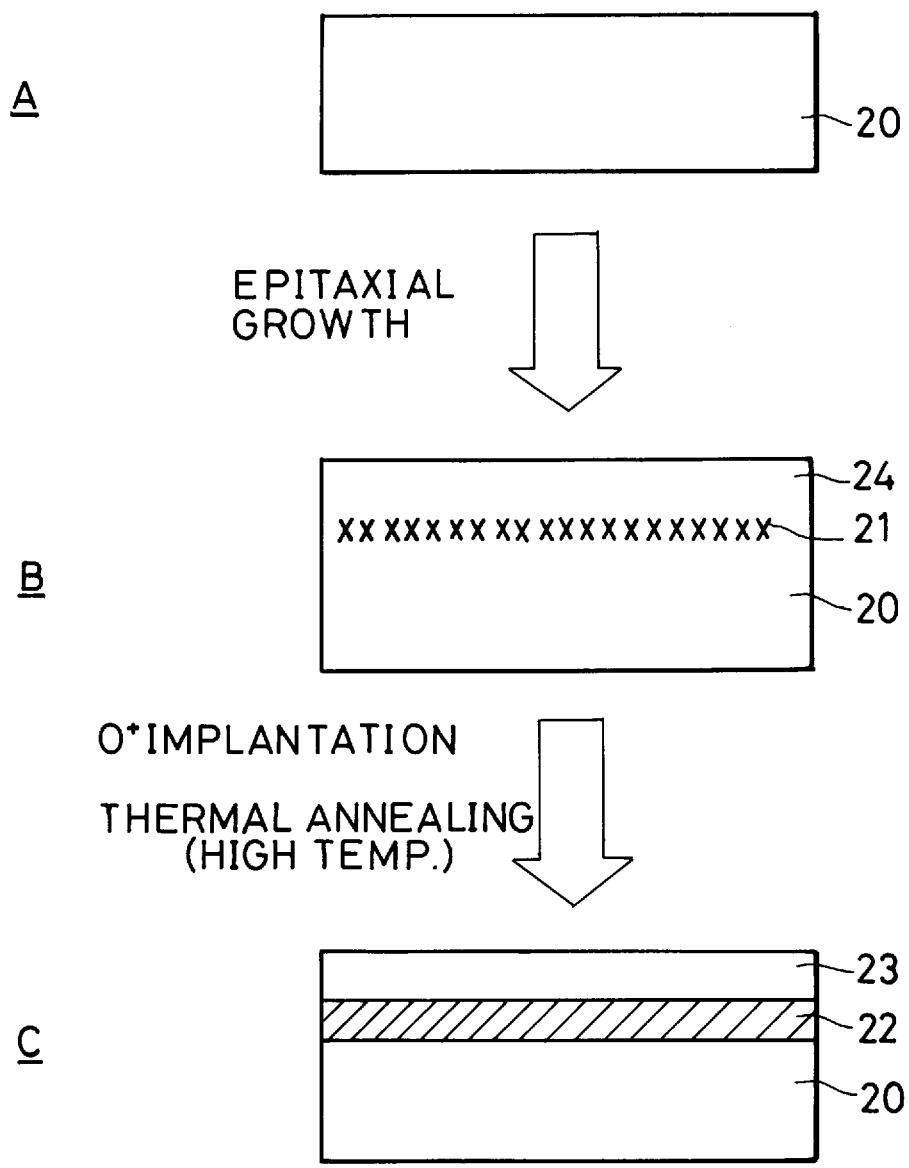

METHOD OF FABRICATING SOI SUBSTRATE

BACKGROUND OF THE INVENTION

1. Field of the Invention

The invention relates to a method of fabricating an SOI (silicon on insulator) substrate having a semiconductor active layer on an insulator, which substrate is considered to be promising as a substrate to be used for next generation LSI.

2. Description of the Related Art

One method of fabricating an SOI substrate having a semiconductor active layer on an insulator is suggested in Sadao Nakashima and Katsutoshi Izumi: "Analysis of buried oxide layer formation and mechanism of threading dislocation generation in the substoichiometric oxygen dose region", Journal of Material Research, Vol. 8, No. 3, pp 523–534, March 1993. The suggested method is the so-called SIMOX (Separation by Implanted Oxygen) technique which includes the steps of implanting oxygen ions (O+) with high doses into a silicon substrate, and applying thermal annealing at high temperature to the silicon substrate to form a continuous silicon dioxide ($SiO_2$) film in the silicon substrate.

The SIMOX process has an advantage that an SOI substrate can be fabricated relatively readily, however, has a shortcoming that crystal defects tend to remain in an upper Si active layer in which semiconductor devices are to be fabricated. The density of the residual crystal defects is dependent on doses of implanted oxygen ions. In general, a higher dose causes a greater number of crystal defects.

Thus, it is necessary to lower the dose of implanted oxygen ion in order to decrease crystal defects. For instance, it is possible to decrease crystal defects by implanting oxygen ions at 180 KeV with doses of $3 \times 10^{17} - 4 \times 10^{17}$ cm$^{-2}$. However, if such low doses of oxygen ions are implanted into a silicon substrate, it is not possible to form a continuous silicon dioxide film even by subsequent thermal annealing at high temperature, thereby causing current leakage. Thus, desired characteristics of a semiconductor device cannot be obtained.

FIG. 1 schematically illustrates a silicon substrate into which low doses of oxygen ions are implanted according to prior art. At first, oxygen ions are implanted with low dosage into a silicon substrate 30, and then thermal annealing at high temperature is applied to the silicon substrate 30, thereby discontinuous dioxide islands 31 are produced in the silicon substrate 30, as illustrated in FIG. 1-B.

As having been described, the SIMOX process, which has a step of implanting oxygen ions (O+) with high dose into a silicon substrate, has an advantage that an SOI substrate can be fabricated relatively easily, but has a shortcoming that crystal defects tend to stay behind in an upper silicon active layer in which a semiconductor device is to be fabricated. On the other hand, if oxygen ions with low dose are implanted into a silicon substrate so as to decrease crystal defects, a continuous silicon dioxide film cannot be formed by subsequent thermal annealing at high temperature with the result of causing current leakage.

SUMMARY OF THE INVENTION

In view of the above mentioned problems of the SIMOX process, it is an object of the present invention to overcome the shortcomings of the SIMOX process. More specifically, it is an object of the present invention to provide a method of fabricating an SOI substrate which method makes it possible to form a continuous silicon dioxide film even if oxygen ions are implanted with low doses, and reduce crystal defects.

The present invention provides a method of fabricating an SOI substrate including the steps of (a) introducing crystal defects at a desired position into a silicon substrate, (b) implanting oxygen ions into the silicon substrate, and (c) applying thermal annealing to the silicon substrate.

In the step (b) of the method, nitrogen may be substituted for oxygen.

For instance the step (a) includes the steps of implanting ions of one of a silicon atom and an atom other than oxygen into the silicon substrate, and applying thermal annealing to the silicon substrate. For another instance, the step (a) includes the steps of forming an epitaxial layer on the silicon substrate, and causing misfit dislocation at an interface between the silicon substrate and the epitaxial layer. The atom other than oxygen is, for instance, boron (B).

The method in accordance with the invention is characterized by the step (a), that is, introducing crystal defects at a desired depth into a silicon substrate prior to implanting oxygen ions into the silicon substrate. The method enables the formation of a continuous silicon dioxide film even by implanting oxygen ions with low dose, which formation was almost impossible according to prior art. The method also makes it possible to reduce crystal defects to almost zero and lower the fabrication cost of an SOI substrate.

Hereinbelow will be explained the method in accordance with the invention in detail. First, there will be explained the reason why a continuous dioxide layer can be formed despite the low dosage of oxygen ions implanted, and crystal defects are decreased.

The inventor investigated the mechanism of how the SOI structure is formed by means of the SIMOX process. As a result of investigation, it has been found that a continuous silicon dioxide film has been already formed immediately after the ion implantation at 180 KeV with doses higher than approximately $1.2 \times 10^{18}$ cm$^{-2}$, and that surrounding oxygen atoms are gathered by subsequent thermal annealing at high temperature, thereby and the SOI structure is completed. However, crystal defects were present in an upper Si active layer.

With doses of $1.2 \times 10^{18}$ cm$^{-2}$ to $3 \times 10^{17}$ cm$^{-2}$, it was found that a silicon substrate was dotted with fine dioxide islands immediately after ion implantation. It was also found that subsequent thermal annealing at high temperature caused some of the fine dioxide islands to grow or vanish, and that dioxide islands which have grown were combined into one to thereby form a continuous silicon dioxide film. However, crystal defects were found similar to the previously mentioned case.

On the other hand, with dose lower than $3 \times 10^{17}$ cm$^{-2}$, a continuous silicon dioxide film was not formed even by subsequent thermal annealing at high temperature. Namely, as illustrated in FIG. 1-B, only discontinuous islands 31 were formed. Such discontinuous islands cause current leakage, resulting in failure of fabrication of an SOI semiconductor device having desired characteristics. However, there were found only quite a small number of crystal defects in an upper Si active layer in a silicon substrate in this case.

Based on the above mentioned inspection about the mechanism of SOI structure formation by means of SIMOX, it was found that density and distribution of silicon dioxide islands to be observed just after ion implantation play an important role for forming a continuous dioxide film. Thus, in the method in accordance with the invention, the location, density and distribution of silicon dioxide islands to be observed immediately after ion implantation are controlled by utilizing the fact that crystal defects introduced in advance into a silicon substrate are likely to capture oxygen atoms, thereby facilitating the formation of a continuous silicon dioxide film by subsequent thermal annealing at high temperature.

Accordingly, the method in accordance with the invention enables the formation of a continuous dioxide film with dosage lower than $3 \times 10^{17}$ cm$^{-2}$, which formation was impossible by prior art methods, and also permits provision of an SOI substrate and an SIMOX substrate, which is one of the SOI substrates, each including only a small number of crystal defects.

In addition, the fact that an SOI or SIMOX substrate can be fabricated with lower dosage than according to the prior art means that a period of time necessary for ion implantation can be shortened, which concurrently gives an advantage of lower processing cost.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 3A–3C is a schematic view illustrating the steps to be carried out in accordance with the third embodiment.

DESCRIPTION OF THE PREFERRED EMBODIMENTS

Preferred embodiments in accordance with the present invention will be explained hereinbelow with reference to the reference examples and with reference to drawings.
[Embodiment 1]

FIGS. 2A–2C illustrates respective steps to be carried out in the first embodiment, while FIGS. 1A–1B illustrates the prior art method which is to be used as the reference example in the following embodiments. Hereinbelow will be explained the first embodiment illustrated in FIGS. 2A–2C in comparison with the reference example 1 illustrated in FIGS. 1A–1B.

First, there were prepared two pairs of p-type 6-inch (100) silicon substrates 10 and 30 illustrated in FIGS. 2A and 1A, respectively, each having a resistivity of 1 to 10Ω·cm. In the first embodiment, silicon ions were implanted into one of the substrates of each pair at 150 KeV with a concentration of $8 \times 10^{15}$ cm$^{-2}$. Since the ion implantation resulted in an amorphous layer as a damaged layer caused thereby in a silicon substrate, thermal annealing at 600° C. for an hour was applied to the damaged silicon substrate in order to repair the damage.

Figure 2:
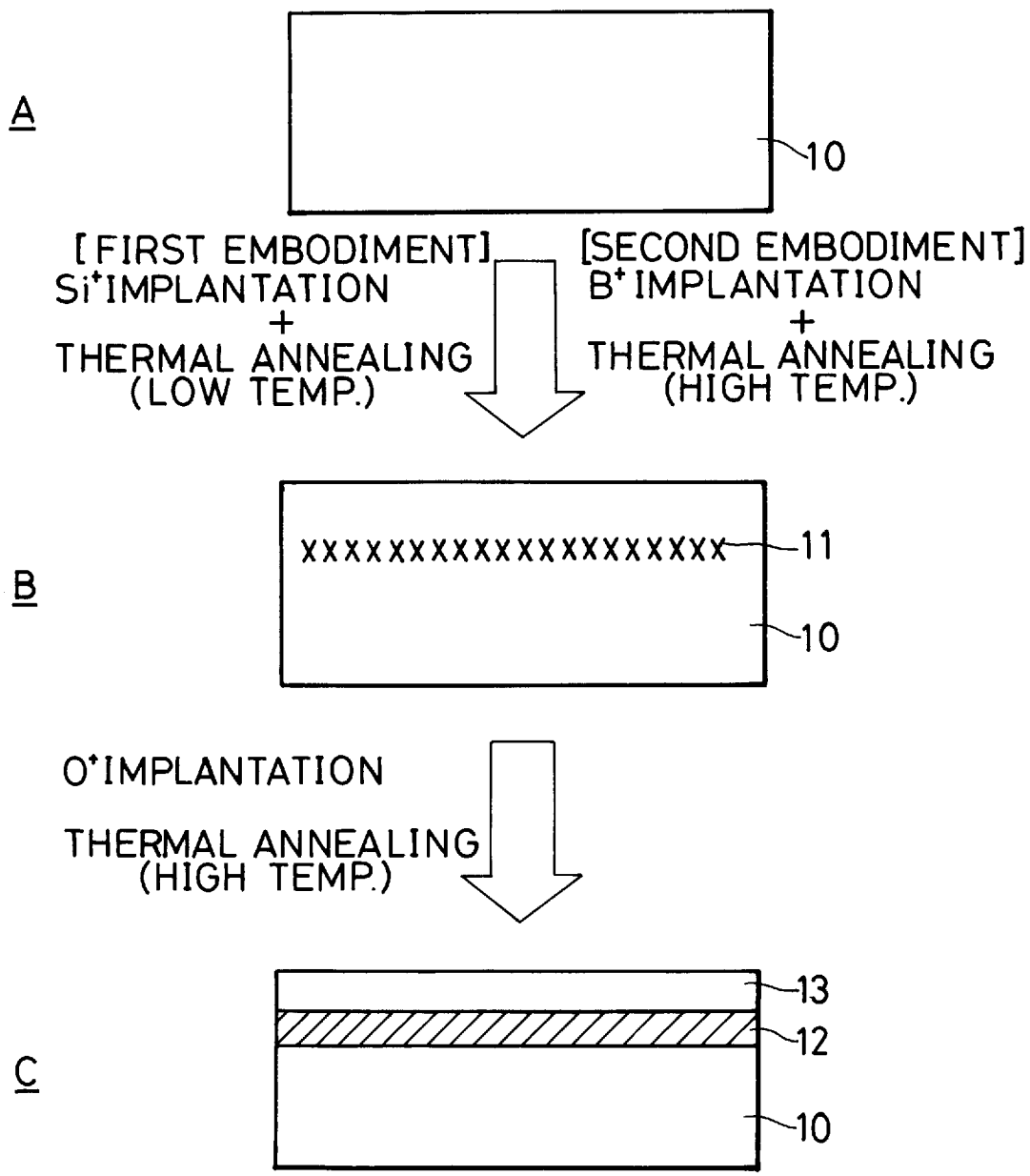
FIGS. 2A–2C is a schematic view illustrating the steps to be carried out in accordance with the first and second embodiments.

The amorphous layer was repair and changed into single crystal in the silicon substrate 10 by applying thermal annealing at 600° C. to the silicon substrate 10. However, as illustrated in FIG. 2-B, there were found a great number of crystal defects 11 in the vicinity of the mean projective range distance of ion implantation. Most of the crystal defects 11 were dislocations.

For comparison with the first embodiment, the thermal annealing at 600° C. for an hour for repair of damage was also applied to the reference example, that is, the silicon substrate 30 illustrated in FIG. 1A into which no silicon ions were implanted.

Then, oxygen atoms were implanted at 60 KeV with dose of $2 \times 10^{17}$ cm$^{-2}$ into both the silicon substrate 10 (the first embodiment) into which silicon ions had been implanted, and the silicon substrate 30 (the first reference example) into which no silicon ions had been implanted. The mean projective range distance of implanted oxygen atoms was almost the same as that of the previously implanted silicon ions.

Then, thermal annealing was applied to both of the silicon substrates at 1350° C. for 4 hours in argon (Ar) atmosphere containing oxygen atoms ($O_2$) therein by 10%.

Figure 1:
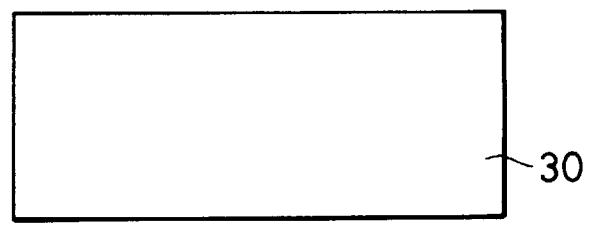
FIGS. 1A–1B is a schematic view illustrating a silicon substrate before and after implanting oxygen ions with a low dosage thereinto by means of prior art.
Figure 1:
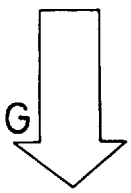
Figure 1:
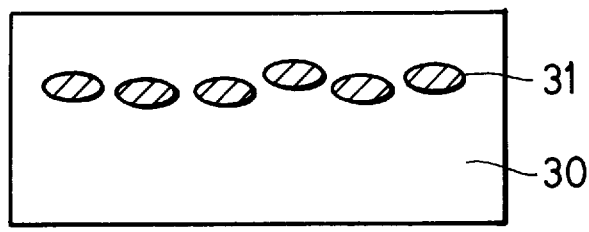

The thus thermally annealed silicon substrates in accordance with the first embodiment and reference example were observed with a transmission type electron microscope using a X-ray topographic method. A continuous silicon dioxide film 12 as illustrated in FIG. 2-C was observed in the silicon substrate 10 (the first embodiment) into which silicon ions had been implanted, while discontinuous dioxide islands 31 as illustrated in FIG. 1-B were observed in the silicon substrate 30 (the first reference example). On the silicone dioxide film 12 is formed a silicon active layer 13. Active silicon layer 13 is formed on the continuous silicon dioxide film 12 by thermal annealing.

In addition, the silicon substrate 10 in accordance with the first embodiment has a crystal defect density of 10 cm$^{-2}$ or smaller, which density is smaller than the density of 100 cm$^{-2}$ to 1000 cm$^{-2}$ with which a continuous dioxide film was formed by means of the prior art SIMOX process.

The specific conditions of ion implantation and thermal annealing as mentioned earlier are shown merely as an example. It should be noted that the scope of the invention is not to be limited to those conditions.

Although silicon was used for the first ion implantation in the first embodiment, the atoms for the first ion implantation is not to be limited to silicon. Other atoms may be substituted for silicon, as explained in the following second embodiment. For instance, the use of boron (B) brings the same advantageous effects as those obtained by the use of silicon.
[Embodiment 2]

Hereinbelow will be explained the second embodiment 2 in comparison with a reference example 2 with reference to FIGS. 2A–2C and 1A–1B.

First, similar to the first embodiment and reference example, there were prepared two pairs of p-type 6-inch (100) silicon substrates 10 and 30 illustrated in FIGS. 2A and 1A, respectively, each having a resistivity of 1 to 10Ω·cm. In the second embodiment, boron ions were implanted into one substrate of each of the pairs if substrates at 180 KeV with dose of $1 \times 10^{15}$ cm$^{-2}$.

Although there is not formed an amorphous layer in the silicon substrate because of a low dosage at this stage unlike the first embodiment, the implanted boron atoms act as impurity atoms, and thus correspond to the crystal defects 11 as illustrated in FIG. 2-B. The boron atoms are active in capturing oxygen atoms.

Then, oxygen atoms were implanted at 180 KeV with dose of $2 \times 10^{17}$ cm$^{-2}$ into both the silicon substrate (the second embodiment) into which boron ions had been implanted, and the silicon substrate (the second reference example) into which no boron ions had been implanted. The mean projective range distance of implanted oxygen atoms was almost the same as that of the previously implanted boron ions.

Then, thermal annealing was applied to both of the silicon substrates at 1350° C. for 4 hours in an argon (Ar) atmosphere containing 10% oxygen atoms ($O_2$) therein.

The thus thermally annealed silicon substrates in accordance with the second embodiment and reference example were observed with a transmission type electron microscope using an X-ray topographic method. A continuous oxide film 12 as illustrated in FIG. 2-C was observed in the silicon substrate 10 (the second embodiment) into which boron ions had been implanted, while discontinuous oxide islands 31 as illustrated in FIG. 1-B were observed in the silicon substrate 30 (the second reference example). By thermal annealing, active silicon layer 23 is formed on the continuous silicon dioxide film 22.

In addition, the silicon substrate 10 in accordance with the second embodiment has crystal defect density of 10 $cm^{-2}$ or smaller, similarly to the first embodiment, which density is smaller than the density of 100 $cm^{-2}$ to 1000 $cm^{-2}$ with which a continuous oxide film was formed by means of the prior art SIMOX process.

[Embodiment 3]

FIGS. 3A–3C illustrates respective steps to be carried out in the third embodiment, while FIGS. 1A–1B illustrates the prior art method. Hereinbelow will be explained the third embodiment illustrated in FIGS. 3A–3C in comparison with the reference example 3 illustrated in FIGS. 1A–1B.

First, similar to the first embodiment and reference example, there were prepared two pairs of n-type 6-inch (100) silicon substrates 20 and 30 illustrated in FIGS. 3A and 1A, respectively, each having a resistivity of 0.01 to 0.02Ω·cm. In the third embodiment, an epitaxial silicon layer 24 as illustrated in FIG. 3-B was grown onto a surface of one of the substrates of each pair of approximately 0.5 μm by means of chemical vapor deposition using disilane gas with the temperature of the substrates being 800° C.

Though impurity doping during epitaxial growth was not carried out in the third embodiment, a difference in lattice constant between the n-type silicon substrate 20 and the epitaxial silicon layer 24 forms crystal defects 21 as illustrated in FIG. 3-B at an interface between a surface of the silicon substrate 20 and the epitaxial silicon layer 24. Most of the crystal defects 21 were misfit dislocations.

Then, oxygen atoms were implanted at 180 KeV with a concentraton of $2 \times 10^{17}$ $cm^{-2}$ into both the silicon substrate 20 (the third embodiment) on which the epitaxial layer 24 had been grown, and the silicon substrate 10 (the third reference example) on which no epitaxial layer had been grown. The mean projective range distance of the implanted oxygen atoms was almost the same as the depth of the previously formed crystal defects 21.

Then, thermal annealing was applied to both of the silicon substrates at 1350° C. for 4 hours in an argon (Ar) atmosphere containing 10% oxygen atoms ($O_2$) therein.

The thus thermally annealed silicon substrates in accordance with the third embodiment and reference example were observed with a transmission type electron microscope using a X-ray topographic method. A continuous silicon dioxide film 22 as illustrated in FIG. 3-C was observed in the silicon substrate 20 (the third embodiment) on which the epitaxial layer 24 was grown, while discontinuous oxide islands 31 as illustrated in FIG. 1-B were observed in the silicon substrate 30 (the third reference example). On the silicon dioxide film 22 is formed a silicon active layer 23.

In addition, the silicon substrate 20 in accordance with the third embodiment has a crystal defect density of 10 $cm^{-2}$ or smaller, similarly to the first and second embodiments, which density is smaller than the density of 100 $cm^{-2}$ to 1000 $cm^{-2}$ with which the continuous oxide film was formed by means of the prior SIMOX process. By thermal annealing, active silicon layer 23 is formed on the continuous silicon dioxide film 22.

Though chemical vapor deposition was used for epitaxial growth in the third embodiment, other methods may be used such as MBE. The specific conditions of growth temperature and ion implantation as mentioned in the third embodiment are shown merely as examples. It should be noted that the scope of the invention is not to be limited to those conditions.

In addition, conductivity types of the silicon substrate and impurity concentration are not limited to those mentioned in the third embodiment. They may be changed as long as the crystal defects 21 are introduced into an interface between the silicon substrate 20 and the epitaxial silicon layer 24.

In the above mentioned first to third embodiments, oxygen atoms are introduced into the silicon substrate and then the silicon substrate is thermally annealed at high temperature in accordance with SIMOX after the crystal defects have been introduced into the substrate, thereby forming a continuous silicon dioxide ($SiO_2$) film.

As a derivative of SIMOX is known a method in which nitrogen ions are implanted into a silicon substrate in place of oxygen ions, and then the silicon substrate is thermally annealed at high temperature to form a continuous nitride ($Si_3N_4$) film, thereby completing an SOI structure. This method also provides a continuous nitride film even with a lower dosage of implanted nitrogen atoms by introducing crystal defects into a silicon substrate at desired depth and location, thereby causing the crystal defects to be decreased and fabrication cost to be reduced.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of fabricating an SOI substrate, comprising the steps, in sequence, of:
    (a) providing a silicon substrate;
    (b) introducing crystal defects at a depth in said silicon substrate by forming an epitaxial layer on said silicon substrate, whereby to cause a misfit dislocation at an interface between said silicon substrate and said epitaxial layer;
    (c) implanting oxygen ions into said silicon substrate; and
    (d) applying thermal annealing to said silicon substrate so as to bond oxygen ions implanted into said silicon substrate at step (c) to said crystal defects introduced at step (b) to create a buried oxide layer at said depth in said silicon substrate and to substantially eliminate presence of said crystal defects introduced at step (b).

2. The method as set forth in claim 1, wherein said step (a) comprises the steps of implanting ions of one of a silicon atom and an atom other than oxygen into said silicon substrate, and applying thermal annealing to said silicon substrate.

3. The method as set forth in claim 2, wherein said atom other than oxygen is boron (B).

4. A method of fabricating an SOI substrate, comprising the steps, in sequence, of:

(a) providing a silicon substrate;

(b) introducing crystal defects at a depth in said silicon substrate by forming an epitaxial layer on said silicon substrate, whereby to cause a misfit dislocation at an interface between said silicon substrate and said epitaxial layer;

(c) implanting nitrogen ions into said silicon substrate; and (d) applying thermal annealing to said silicon substrate so as to bond the nitrogen ions implanted into said silicon substrate at step (c) to said crystal defects introduced at step (b) to create a buried oxide layer at said depth in said silicon substrate and to substantially eliminate presence of said crystal defects introduced at step (b).

5. The method as set forth in claim 4, wherein said step (a) comprises the steps of implanting ions of one of a silicon atom and an atom other than oxygen into said silicon substrate, and applying thermal annealing to said silicon substrate.

6. The method as set forth in claim 5, wherein said atom other than oxygen is boron (B).

7. A method of fabricating an SOI substrate, comprising the steps, in sequence, of:

(a) providing a silicon substrate;

(b) introducing crystal defects at a depth in said silicon substrate by implanting ions of one of a silicon atom and an atom other than oxygen into said silicon substrate, and applying thermal annealing to said silicon substrate whereby to cause a misfit dislocation at an interface between said silicon substrate and said epitaxial layer;

(c) implanting oxygen ions into said silicon substrate from step (b); and (d) applying thermal annealing to said silicon substrate from step (c) so as to bond oxygen ions implanted into said silicon substrate at step (c) to said crystal defects introduced at step (b) to create a buried oxide layer at said depth in said silicon substrate and to substantially eliminate presence of said crystal defects introduced at step (b).

8. The method as set forth in claim 7, wherein said atom other than oxygen is boron (B).

9. A method of fabricating an SOI substrate, comprising the steps, in sequence, of:

(a) providing a silicon substrate;

(b) introducing crystal defects at a depth in said silicon substrate implanting ions of one of a silicon atom and an atom other than oxygen into said silicon substrate, and applying thermal annealing to said silicon substrate whereby to cause a misfit dislocation at an interface between said silicon substrate and said epitaxial layer;

(c) implanting nitrogen ions into said silicon substrate from step (b); and (d) applying thermal annealing to said silicon substrate from step (c) so as to bond the nitrogen ions implanted into said silicon substrate at step (c) to said crystal defects introduced at step (b) to create a buried oxide layer at said depth in said silicon substrate and to substantially eliminate presence of said crystal defects introduced at step (b).

10. The method as set forth in claim 9, wherein said atom other than oxygen is boron (B).

* * * * *